(12) United States Patent
Kim et al.

(10) Patent No.: US 11,614,815 B2
(45) Date of Patent: Mar. 28, 2023

(54) TOUCH DISPLAY DEVICE WITH AN EDGE MARK LAYER

(71) Applicant: LG Display Co., Ltd., Seoul (KR)

(72) Inventors: Sul-Ki Kim, Paju-si (KR); Gue-Tai Lee, Daegu (KR); Jin-Yeol Kim, Sangju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 106 days.

(21) Appl. No.: 16/941,103

(22) Filed: Jul. 28, 2020

(65) Prior Publication Data
US 2021/0034185 A1 Feb. 4, 2021

(30) Foreign Application Priority Data
Jul. 30, 2019 (KR) .................. 10-2019-0092247

(51) Int. Cl.
*G06F 3/041* (2006.01)
*G06F 3/044* (2006.01)
*H01L 27/32* (2006.01)

(52) U.S. Cl.
CPC .......... *G06F 3/0412* (2013.01); *G06F 3/0446* (2019.05); *H01L 27/323* (2013.01); *H01L 27/3223* (2013.01); *G06F 3/04164* (2019.05); *G06F 2203/04111* (2013.01); *G06F 2203/04112* (2013.01)

(58) Field of Classification Search
None
See application file for complete search history.

(56) References Cited

U.S. PATENT DOCUMENTS

| 2011/0310033 A1* | 12/2011 | Liu | G06F 3/0412 |
| | | | 345/173 |
| 2014/0054070 A1* | 2/2014 | Ichiki | G06F 3/0445 |
| | | | 174/253 |

(Continued)

FOREIGN PATENT DOCUMENTS

| EP | 3422163 A1 | 1/2019 |
| GB | 2566789 A | 3/2019 |

(Continued)

OTHER PUBLICATIONS

UK Search Report issued in corresponding UK Patent Application No. 2011433.6, dated Dec. 7, 2020.

*Primary Examiner* — Amare Mengistu
*Assistant Examiner* — Sarvesh J Nadkarni
(74) *Attorney, Agent, or Firm* — Morgan, Lewis & Bockius LLP (57) ABSTRACT

A touch display device has an inspection process and a repair process that may be easily performed. The touch display device includes first and second touch electrodes spaced apart from each other and a dummy conductive layer spaced apart from at least one of the first touch electrodes and the second touch electrodes, and is characterized in that the shape of at least one of the first touch electrodes and the second touch electrodes arranged in first boundary areas is different from the shape of at least one of the first touch electrodes, the second touch electrodes and the dummy conductive layer arranged in second boundary areas, thereby rapidly detecting the position of a defect and improving efficiency of inspection and repair processes.

14 Claims, 11 Drawing Sheets

(56) References Cited

U.S. PATENT DOCUMENTS

| | | | |
|---|---|---|---|
| 2014/0184939 A1* | 7/2014 | Lai | G06F 3/0443 |
| | | | 349/12 |
| 2014/0232959 A1* | 8/2014 | Kuriki | G06F 3/0445 |
| | | | 349/12 |
| 2015/0085205 A1* | 3/2015 | Chen | G06F 3/0448 |
| | | | 349/12 |
| 2015/0363024 A1* | 12/2015 | Hayashi | G06F 3/0446 |
| | | | 345/174 |
| 2017/0185224 A1* | 6/2017 | Nagata | G02F 1/13338 |
| 2018/0039360 A1 | 2/2018 | Akimoto et al. | |
| 2019/0004638 A1* | 1/2019 | Lee | G06F 3/0443 |
| 2019/0146608 A1 | 5/2019 | Lee et al. | |
| 2019/0237148 A1 | 8/2019 | Senoo et al. | |
| 2019/0302936 A1* | 10/2019 | Clark | G06F 3/0443 |

FOREIGN PATENT DOCUMENTS

| | | |
|---|---|---|
| KR | 10-2018-015572 A | 2/2018 |
| KR | 10-2019-002827 A | 1/2019 |
| KR | 10-2019-0092247 A | 8/2019 |

\* cited by examiner

TOUCH DISPLAY DEVICE WITH AN EDGE MARK LAYER

This application claims the benefit of Korean Patent Application No. 10-2019-0092247, filed on Jul. 30, 2019, which is hereby incorporated by reference as if fully set forth herein.

BACKGROUND

Technical Field

The present disclosure relates to a display device, and more particularly, to a touch display device in which an inspection process and a repair process may be easily performed.

Discussion of the Related Art

A touchscreen is an input device, to which a user command may be input by selecting content appearing on a screen of a display device or the like using a human hand or an object. Such a touchscreen may be substituted for a separate input device which is connected to a display device so as to be operated, such as a keyboard or a mouse, and thus the application range thereof is being gradually increased. The touchscreen includes a plurality of first and second touch electrodes, and determines whether or not a touch occurs and accurately detects coordinates of a touch position based on a change in capacitance between the first and second touch electrodes. Here, when a distance between the first and second touch electrodes is shortened in order to raise the capacitance between the first and second touch electrodes, a short may occur between the first and second touch electrodes. Therefore, measures to facilitate an inspection process and a repair process for shorts between the first and second touch electrodes are currently required.

SUMMARY

Accordingly, embodiments of the present disclosure are directed to a touch display device that substantially obviates one or more problems due to limitations and disadvantages of the related art.

An aspect of the present disclosure is to provide a touch display device in which an inspection process and a repair process may be easily performed.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, as embodied and broadly described herein, a touch display device comprises first touch electrodes and second touch electrodes configured to be spaced apart from each other, and a dummy conductive layer spaced apart from at least one of the first touch electrodes and second touch electrodes, wherein a shape of at least one of the first touch electrodes and the second touch electrodes arranged in first boundary areas is different from a shape of at least one of the first touch electrodes, the second touch electrodes and the dummy conductive layer arranged in second boundary areas.

It is to be understood that both the foregoing general description and the following detailed description of the present invention are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure. In the drawings.

DETAILED DESCRIPTION

Reference will now be made in detail to embodiments of the present disclosure, examples of which are illustrated in the accompanying drawings.

Figure 1:
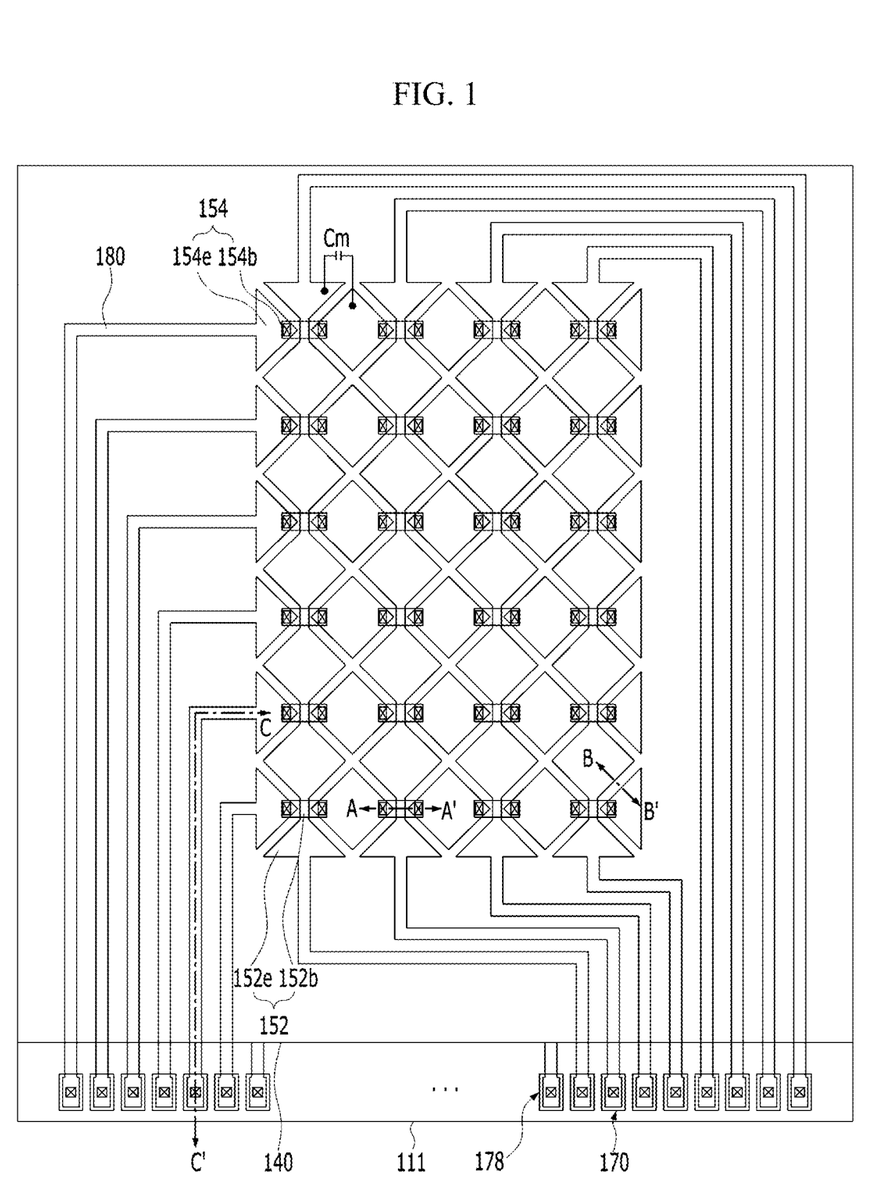
FIG. 1 is a plan view illustrating a touch display device according to one embodiment of the present invention.

FIG. 1 is a plan view illustrating a touch display device according to one embodiment of the present invention.

The touch display device shown in FIG. 1 performs a touch sensing function and a display function. That is, the touch display device displays an image through subpixels arranged in a matrix, and performs the touch sensing function using a plurality of first and second touch electrodes 152e and 154e.

The first touch electrodes 152e are spaced apart from one another by uniform intervals in a first direction, and are conductively connected to adjacent first touch electrodes 152e through first bridges 152b. Here, the first bridges 152b are arranged on the same plane as the first touch electrodes 152e, and are thus conductively connected to the first touch electrodes 152e without separate contact holes. The first touch electrodes 152e conductively connected through the first bridges 152b form touch driving lines 152 extending in the first direction.

The second touch electrodes 154e are spaced apart from one another by uniform intervals in a second direction intersecting the first direction, and are conductively connected to adjacent second touch electrodes 154e through second bridges 154b. Here, the second bridges 154b are conductively connected to the second touch electrodes 154e through touch contact holes 158. The second touch electrodes 154e conductively connected through the second bridges 154b form touch sensing lines 154 extending in the second direction. Although a structure in which the second touch electrodes 154e are connected to the second bridges 154b through the touch contact holes 158 has been illustrated as one example, the first touch electrodes 152e may be connected to the first bridges 152b through the touch contact holes 158 and the second touch electrodes 154e may be connected to the second bridges 154b without the touch contact holes 158.

A user's touch is sensed using a mutual-capacitance (Cm)-based touch sensing method using the touch driving lines 152 and the touch sensing lines 154. That is, when a touch driving signal to detect a touch is supplied to the touch driving lines 152, capacitance between the touch driving lines 152 and the touch sensing lines 154 is changed depending on whether or not a user's touch occurs, and whether or not a touch occurs and/or coordinates of a touch position are determined using touch sensing signals transmitted from the touch sensing lines 154 to a touch driving circuit (not shown) due to a change in the capacitance.

Each of the touch driving lines 152 and the touch sensing lines 154 is connected to a touch pad 170 through a routing line 180. Here, the routing lines 180 are arranged on at least one of left, right, lower and upper sides of a substrate 111. For example, the routing lines 180 connected to the touch driving lines 152 are arranged on the upper, right and lower sides of the substrate 111, and the routing lines 180 connected to the touch sensing lines 154 are arranged on the left side of the substrate 111.

The touch pads 170 are arranged in a non-active area of the substrate 111. Here, when the subpixels arranged on the substrate 111 include a light emitting layer, the touch pads 170 are exposed by an encapsulation unit 140 configured to encapsulate the light emitting layer.

The touch pads 170 together with display pads 178 may be arranged in a non-active area arranged in at least one of one side region and the other side region of the substrate 111, or the touch pads 170 may be arranged in another non-active area different from the non-active area in which the display pads 178 are arranged.

Figure 2:
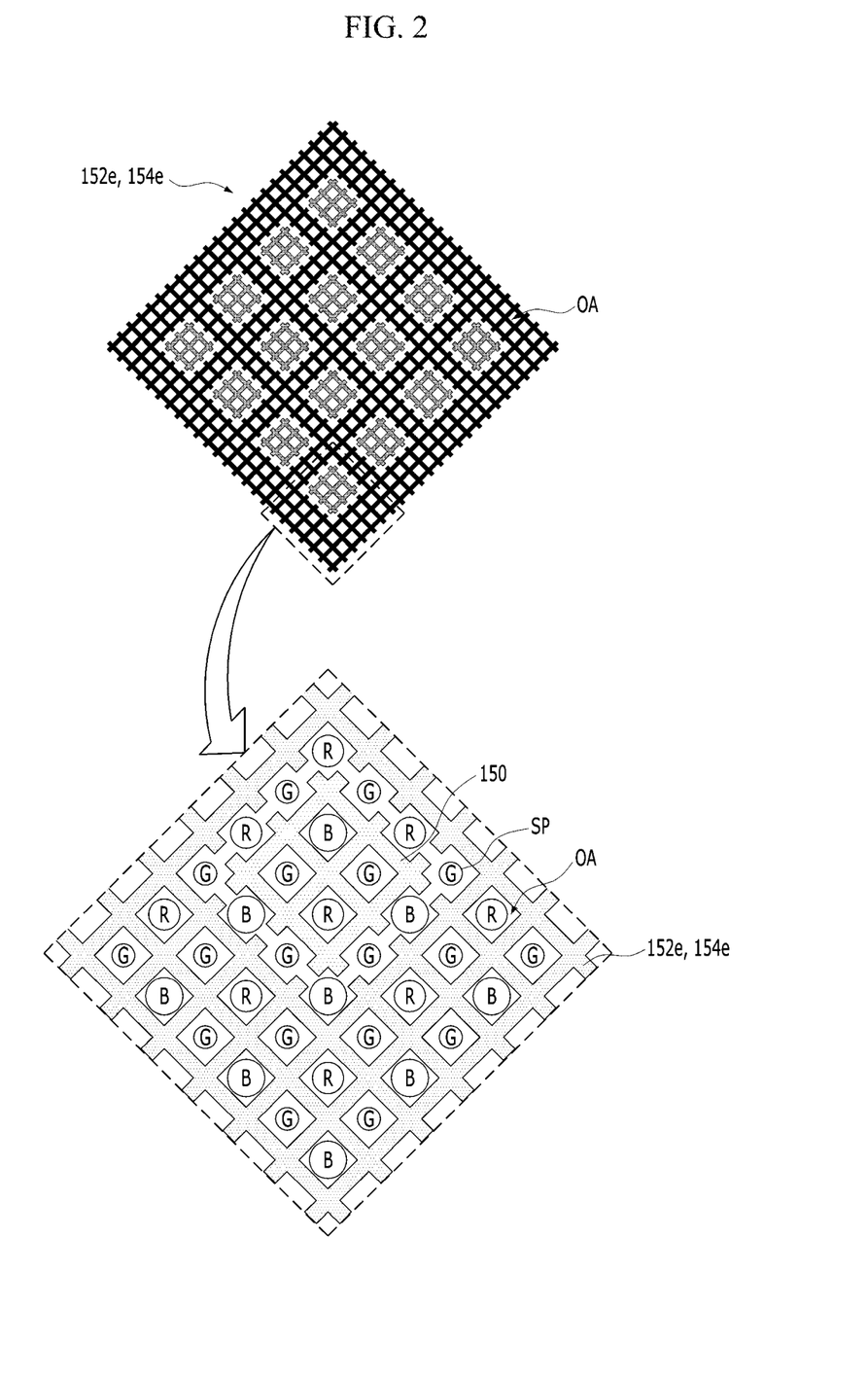
FIG. 2 is a plan view illustrating first and second touch electrodes shown in FIG. 1 in more detail.

FIG. 2 is a plan view illustrating the first and second touch electrodes shown in FIG. 1 in more detail.

The first and second touch electrodes 152e and 154e shown in FIG. 2 may be formed in a monolayer or multilayer structure using a touch metal layer having excellent corrosion resistance and acid resistance and high conductivity, formed of at least one of Ta, Ti, Cu and Mo. For example, the first and second touch electrodes 152e and 154e may be formed in a three-layer stack structure, such as Ti/Al/Ti, MoTi/Cu/MoTi or Ti/Al/Mo. The touch metal layers forming the first and second touch electrodes 152e and 154e have higher conductivity than a transparent conductive layer, and thus, the first and second touch electrodes 152e and 154e may be formed as low-resistance electrodes. Therefore, the resistance of the first and second touch electrodes 152e and 154e and the capacitance therebetween are decreased, and thus, an RC delay may be reduced and touch sensitivity may be improved.

The first and second touch electrodes 152e and 154e using the touch metal layer are formed as a mesh having a plurality of opening areas OA. If the opening areas OA are applied to subpixels SP having a light emitting layer, the opening areas OA are formed to overlap respective emitting areas of red (R) subpixels SP, green (G) subpixels SP and blue (B) subpixels SP. The mesh-type first and second touch electrodes 152e and 154e are formed to overlap non-emitting areas between the emitting areas, for example, banks. Therefore, the first and second touch electrodes 152e and 154e may prevent deterioration of an aperture ratio and transmittance.

A floating dummy conductive layer 150 is arranged in at least some areas of each of the first and second touch electrodes 152e and 154e. The dummy conductive layer 150 is formed of the same material on the same plane as the first and second touch electrodes 152e and 154e, and thus, the dummy conductive layer 150 is arranged to be spaced apart from the first and second touch electrodes 152e and 154e.

Figure 3:
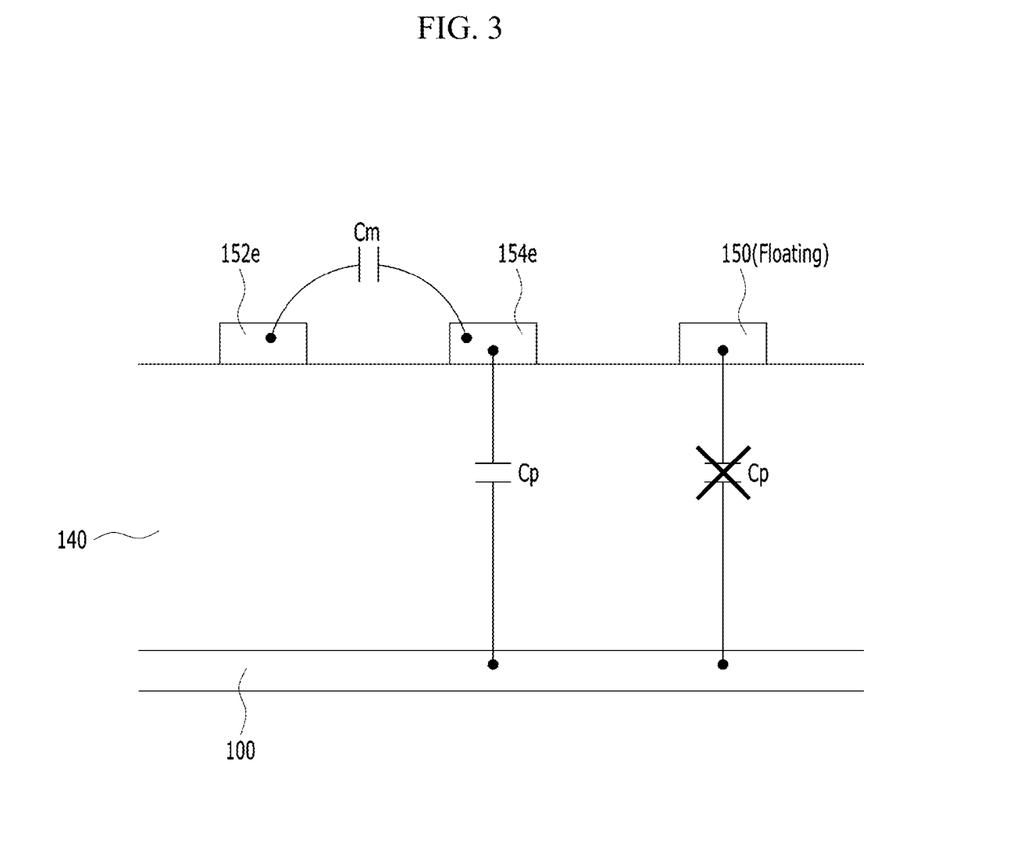
FIG. 3 is a view illustrating relationships between the first and second touch electrodes and a dummy conductive layer shown in FIG. 2.

Therefore, parasitic capacitance Cp does not occur between the floating dummy conductive layer 150 and display electrodes 100 of the respective subpixels arranged below the floating dummy conductive layer 150, as shown in FIG. 3. Here, if the subpixels include the light emitting layer, the first and second touch electrodes 152e and 154e and the dummy conductive layer 150 overlap the display electrodes 100, i.e., cathodes, of the subpixels, with the encapsulation unit 140 interposed therebetween. Parasitic capacitance occurs between each of the first and second touch electrodes 152e and 154e and the display electrode 100, but no parasitic capacitance occurs between the dummy conductive layer 150 in the floating state and the display electrode 100. Thereby, compared to a comparative example in which no dummy conductive layer 150 is arranged in the first and second touch electrodes 152e and 154e, the structure according to the present invention in which the dummy conductive layer 150 is arranged in the first and second touch electrodes 152e and 154e may reduce occurrence of the parasitic capacitance between each of the first and second touch electrodes 152e and 154e and the display electrode 100.

The dummy conductive layer 150 is formed of the same material on the same plane as the first and second touch electrodes 152e and 154e. Particularly, the dummy conductive layer 150 is formed as a mesh in the same manner as the first and second touch electrodes 152e and 154e. In this case, when an electrical short occurs between the first and second touch electrodes 152e and 154e, it is difficult to detect the position of the short and it is difficult to distinguish an electrical short between the first and second touch electrodes 152e and 154e, which is an actual defect, and a short between the first or the second touch electrode 152e or 154e and the dummy conductive layer 150, which is not an actual defect, from each other. Therefore, in the present invention, first boundary areas BA1, in which the first and second touch electrodes 152e and 154e are arranged, and second boundary areas BA2, in which the dummy conductive layer 150 and the first and second touch electrodes 152e and 154e are arranged, have different cross-sectional shapes.

Figure 4:
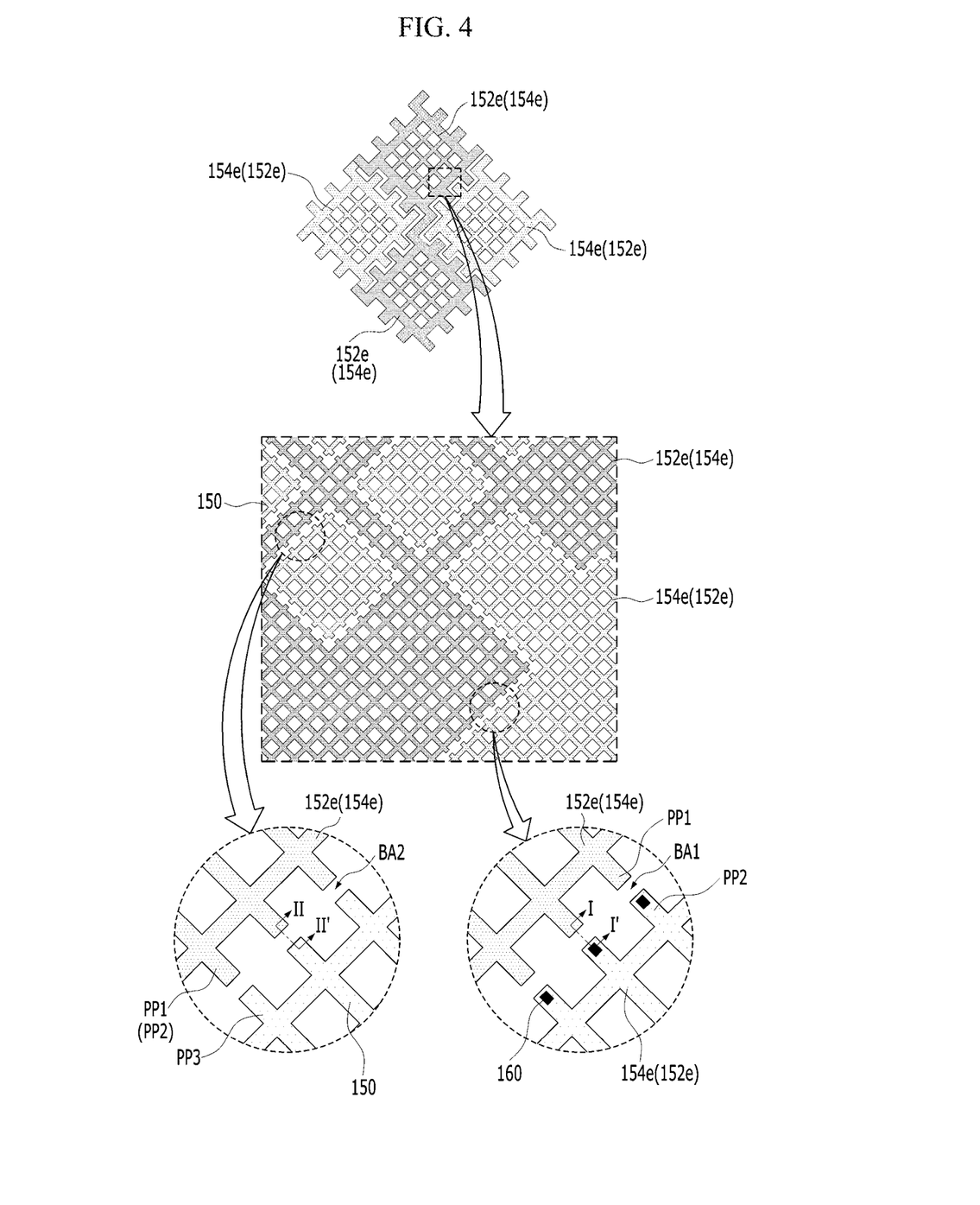
FIG. 4 is a plan view illustrating the first and second touch electrodes and the dummy conductive layer shown in FIG. 2.

The first touch electrodes 152e, the second touch electrodes 154e and the dummy conductive layer 150 shown in FIG. 4 have protrusions PP1, PP2 and PP3, respectively. The first touch electrodes 152e have first protrusions PP1 extending towards the first boundary areas BA1 between the first touch electrodes 152e and the second touch electrodes 154e and the second boundary areas BA2 between the first touch electrodes 152e and the dummy conductive layer 150. The second touch electrodes 154e have second protrusions PP2 extending towards the first boundary areas BA1 between the first touch electrodes 152e and the second touch electrodes 154e and the second boundary areas BA2 between the second touch electrodes 154e and the dummy conductive layer 150. The dummy conductive layer 150 has third protrusions PP3 extending towards the second boundary areas BA2 between each of the first and second touch electrodes 152e and 154e and the dummy conductive layer 150.

Figure 5A:
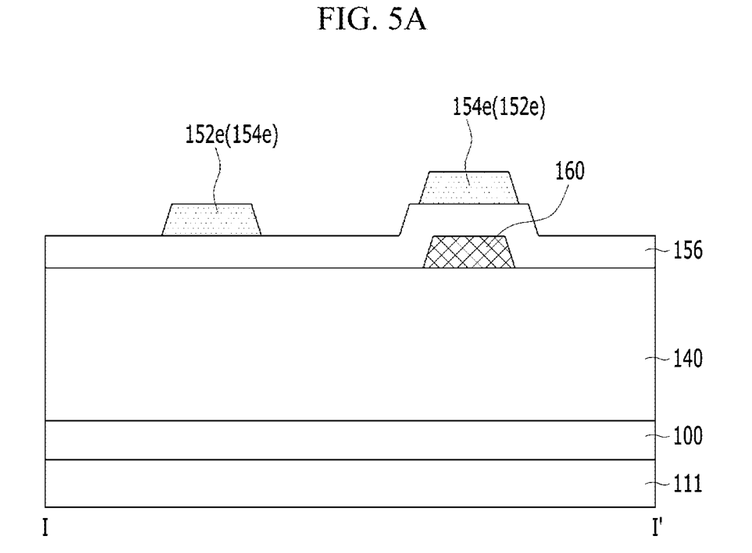
FIGS. 5A and 5B are cross-sectional views of the touch display device, taken along lines I-I' and II-II' of FIG. 4.
Figure 5B:
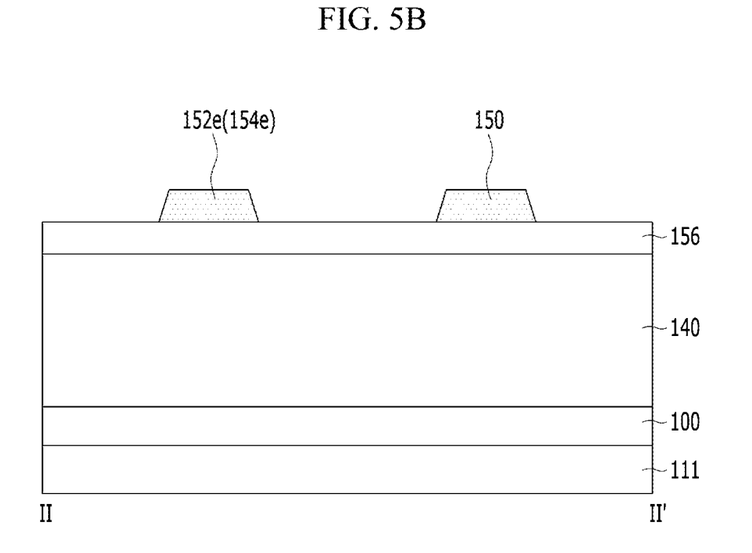

Here, an edge mark layer 160 is selectively formed in one of the first boundary areas BA1 or the second boundary areas BA2. For example, the edge mark layer 160 may be formed in the first boundary area BA1, as shown in FIG. 5A, and may not be formed in the second boundary area BA2, as shown in FIG. 5B. When the first and second touch electrodes 152e and 154e arranged in the first boundary area BA1 are shorted, a touch sensing operation is not performed, but, in contrast, when the first or second touch electrode 152e or 154e and the dummy conductive layer 150 in the floating state arranged in the second boundary area BA2 are shorted, a touch sensing operation is not affected. Therefore, the edge mark layer 160 is formed in the first boundary areas BA1 which require a repair process due to occurrence of a short, and is not formed in the second boundary areas BA2 which do not require the repair process in spite of occurrence of a short. Even if the edge mark layer 160 is formed in the first boundary areas BA1, a distance between the first and second protrusions PP1 and PP2 arranged in the first boundary area BA1 is not changed, and thus, a change in mutual capacitance occurring between the first and second protrusions PP1 and PP2 may be prevented.

The edge mark layer 160 is arranged on a different plane from the first and second touch electrodes 152e and 154e, as shown in FIG. 5A. For example, the edge mark layer 160 is formed of the same material on the same plane as the second bridges 154b. The edge mark layer 160 may be formed under and/or formed to overlap at least one of the first and second protrusions PP1 and PP2 arranged in the first boundary area BA1 with a touch insulating film 156 interposed therebetween. The edge mark layer 160 may be formed as islands under the respective first and second protrusions. The respective protrusions PP1 or PP2 arranged in the first boundary area BA1 thus may protrude further from the substrate 111 than the protrusions PP1, PP2 and PP3 arranged in the second boundary area BA2. The cross-sectional shape of the first boundary area BA1, in which the edge mark layer 160 is arranged, protrudes further than the cross-sectional shape of the second boundary area BA2. That is, the cross-sectional shape of the first boundary area BA1 protrudes further than the cross-sectional shape of the second boundary area BA2 from the substrate 111. Since the first boundary area BA1, which protrudes owing to the edge mark layer 160, is visibly different from the second boundary area BA2, in which the edge mark layer 160 is not arranged, when observed using inspection equipment, an inspector may easily distinguish the first and second boundary areas BA1 and BA2 from each other. Therefore, the inspector may easily recognize an electrical short between the first and second touch electrodes 152e and 154e arranged in the first boundary area BA1 and easily detect the position of the short where the repair process is necessary, thereby being capable of improving efficiency of the inspection and repair processes. Further, the present invention may have effects, such as reduced labor costs, owing to reduced fatigue of the inspector, and yield improvement.

Figure 6:
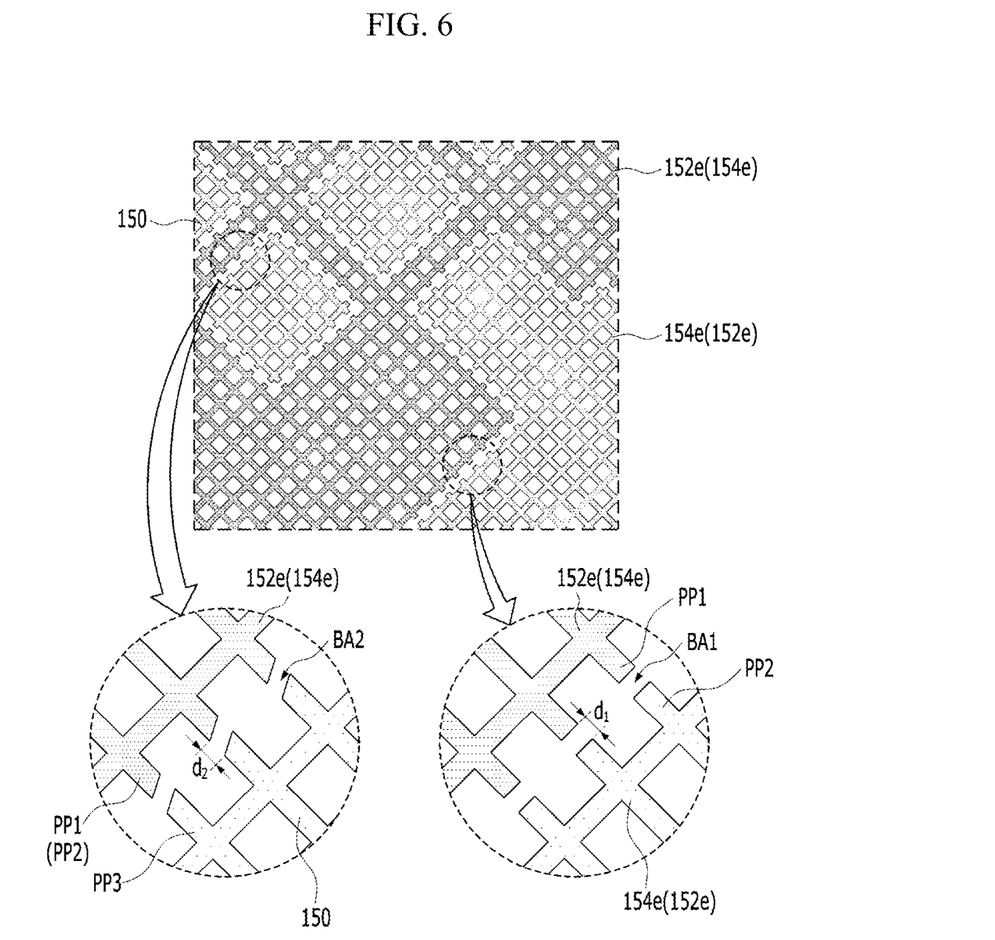
FIG. 6 is a plan view illustrating first and second touch electrodes and a dummy conductive layer of a touch display device according to another embodiment of the present invention.

FIG. 6 is a plan view illustrating some parts of first and second touch electrodes of a touch display device according to another embodiment of the present invention.

The touch display device shown in FIG. 6 includes the same elements as those in the touch display device shown in FIG. 4 except that protrusions PP1, PP2 and PP3 arranged in first and second boundary areas BA1 and BA2 have different planar shapes instead of formation of the edge mark layer. Therefore, a detailed description of the elements of the touch display device according to this embodiment, which are the same as those of the touch display device according to the former embodiment, will be omitted.

The length of opposing sides of the protrusions PP1, PP2 and PP3 arranged in one of the first and second boundary areas BA1 and BA2 is different from the length of opposing sides of the protrusions PP1, PP2 and PP3 arranged in the other of the first and second boundary areas BA1 and BA2. For example, the opposing sides of the protrusions PP1, PP2 and PP3 arranged in the second boundary areas BA2 have tips formed diagonally, so that the length of the opposing sides of the first or second protrusions PP1 or PP2 and the third protrusions PP3 arranged in the second boundary area BA2 is longer than the length of the opposing sides of the first and second protrusions PP1 and PP2 arranged in the first boundary area BA1. The internal angle of the tip of each of the first to third protrusions PP1, PP2 and PP3 arranged in the second boundary areas BA2 is formed as an acute angle, and the internal angle of the tip of the first and second protrusions PP1 and PP2 arranged in the first boundary areas BA1 is formed to be greater than the internal angle of the tip of the first to third protrusions PP1, PP2 and PP3 arranged in the second boundary areas BA2. For example, the internal angle of the tip of the first and second protrusions PP1 and PP2 arranged in the first boundary areas BA1 is a right angle.

A distance d1 between the first and second protrusions PP1 and PP2 facing each other and arranged in the first boundary area BA1 is the same as a distance d2 between the first or second protrusions PP1 or PP2 and the third protrusions PP3 facing each other and arranged in the second boundary area BA2. Therefore, the distance d1 between the first and second protrusions PP1 and PP2 arranged in the first boundary area BA1 is not changed, and thus, a change in mutual capacitance occurring between the first and second protrusions PP1 and PP2 arranged in the first boundary area BA1 may be prevented.

As such, in the touch display device according to this embodiment of the present invention, the shape of the protrusions PP1 and PP2 arranged in the first boundary areas BA1 and the shape of the protrusions PP1, PP2 and PP3 arranged in the second boundary areas BA2 are different. The first and second boundary areas BA1 and BA2 including the protrusions PP1, PP2 and PP3 having different shapes are visibly different when observed using inspection equipment. Therefore, an inspector may easily recognize an electrical short between the first and second touch electrodes 152e and 154e arranged in the first boundary area BA1 and easily detect the position of the short where the repair process is necessary, thereby being capable of improving efficiency of the inspection and repair processes.

Figure 7:
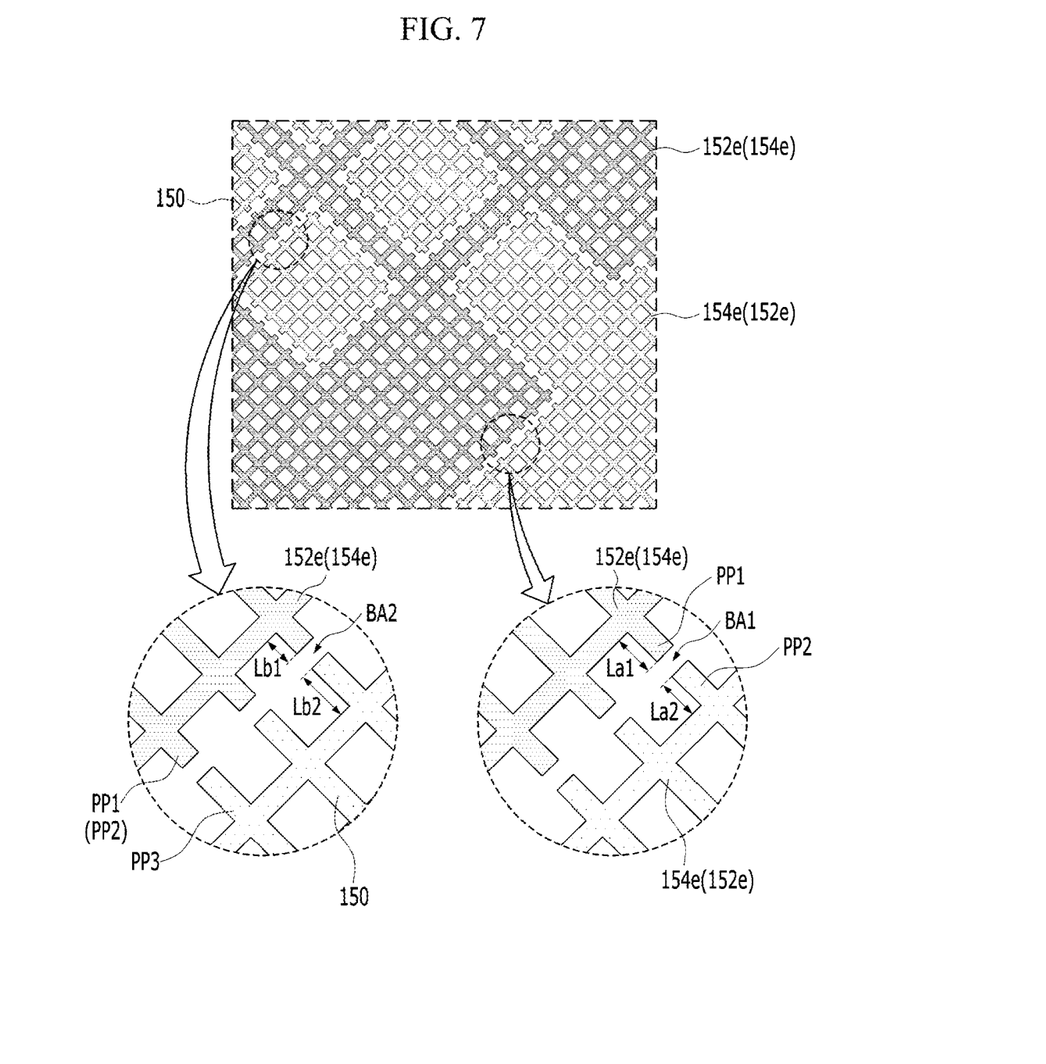
FIG. 7 is a plan view illustrating first and second touch electrodes and a dummy conductive layer of a touch display device according to yet another embodiment of the present invention.

FIG. 7 is a plan view illustrating some parts of first and second touch electrodes of a touch display device according to yet another embodiment of the present invention.

The touch display device shown in FIG. 7 includes the same elements as those in the touch display device shown in FIG. 4 except that protrusions PP1, PP2 and PP3 arranged in first and second boundary areas BA1 and BA2 have different lengths instead of formation of the edge mark layer. Therefore, a detailed description of the elements of the touch display device according to this embodiment, which are the same as those of the touch display device according to the former embodiment, will be omitted.

Figure 8:
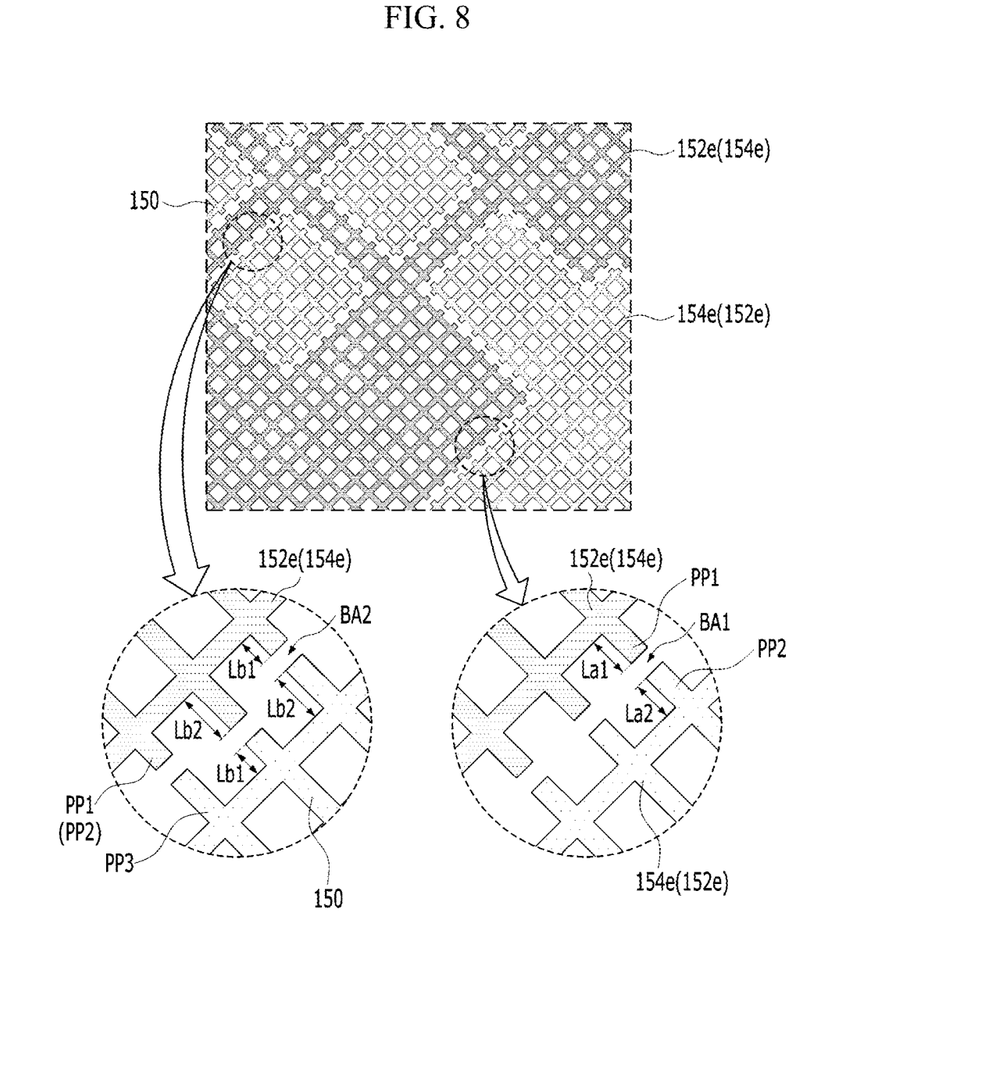
FIG. 8 is a plan view illustrating another embodiment of first to third protrusions shown in FIG. 7.

The length of the protrusions PP1, PP2 and PP3 arranged in one of the first and second boundary areas BA1 and BA2 is different from the length of the protrusions PP1, PP2 and PP3 arranged in the other of the first and second boundary areas BA1 and BA2. For example, the length La1 of the first protrusions PP1 and the length La2 of the second protrusions PP2, arranged in the first boundary area BA1 are the same. On the other hand, the length Lb1 of the first or second protrusions PP1 or PP2 arranged in the second boundary area BA2 are different from the length Lb2 of the third protrusions PP3. For example, the length Lb1 of the first or second protrusions PP1 or PP2 arranged in the second boundary area BA2 may be shorter or longer than the length Lb2 of the third protrusions PP3, as shown in FIG. 7, or the length of the first or second protrusions PP1 or PP2 and the length of the third protrusions PP3 arranged in the second boundary area BA2 may be alternately changed between a short length Lb1 and a long length Lb2, as shown in FIG. 8.

Therefore, a space between the first and second protrusions PP1 and PP2 arranged in the first boundary area BA1 is arranged at the center of the first boundary area BA1, but a space between the first or second protrusion PP1 or PP2 and the third protrusion PP3 arranged in the second boundary area BA2 is arranged at at least one of one side and the other side of the second boundary area BA2. In this case, the distance of (or the space between) the first and second protrusions PP1 and PP2 arranged in the first boundary area BA1 is not changed, and thus, a change in mutual capacitance occurring between the first and second protrusions PP1 and PP2 may be prevented.

As such, in the touch display device according to this embodiment of the present invention, the lengths of the protrusions PP1 and PP2 arranged in the first boundary areas BA1 and the lengths of the protrusions PP1, PP2 and PP3 arranged in the second boundary areas BA2 are different. The first and second boundary areas BA1 and BA2 including the protrusions PP1, PP2 and PP3 having different lengths are visibly different when observed using inspection equipment. Therefore, an inspector may easily recognize an electrical short defect between the first and second touch electrodes 152e and 154e arranged in the first boundary area BA1 and easily detect the position of the defect where the repair process is necessary, thereby being capable of improving efficiency of the inspection and repair processes.

Figure 9:
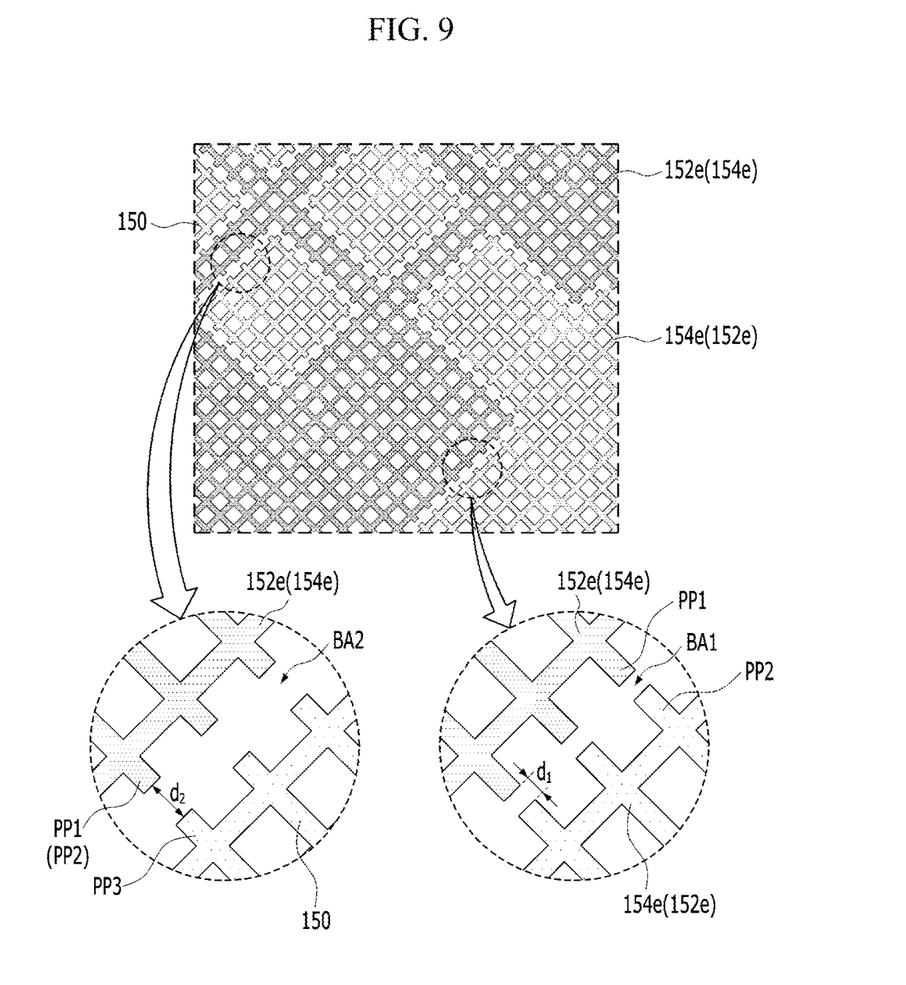
FIG. 9 is a plan view illustrating first and second touch electrodes and a dummy conductive layer of a touch display device according to still another embodiment of the present invention.

FIG. 9 is a plan view illustrating some parts of first and second touch electrodes of a touch display device according to still another embodiment of the present invention.

The touch display device shown in FIG. 9 includes the same elements as those in the touch display device shown in FIG. 4 except that distances d1 and d2 between protrusions PP1, PP2 and PP3 arranged in first and second boundary areas BA1 and BA2 are different instead of formation of the edge mark layer. Therefore, a detailed description of the elements of the touch display device according to this embodiment, which are the same as those of the touch display device according to the former embodiment, will be omitted.

A distance between the protrusions PP1, PP2 and PP3 facing each other and arranged in one of the first and second boundary areas BA1 and BA2 is different from a distance between the protrusions PP1, PP2 and PP3 facing each other and arranged in the other of the first and second boundary areas BA1 and BA2. For example, a distance d2 between the first or second protrusions PP1 or PP2 and the third protrusions PP3 arranged in the second boundary area BA2 is longer or shorter than a distance d1 between the first and second protrusions PP1 and PP2 arranged in the first boundary area BA1. In this case, the length of the first or second protrusions PP1 or PP2 and the third protrusions PP3 arranged in the second boundary area BA2 is shorter or longer than the length of the first and second protrusions PP1 and PP2 arranged in the first boundary area BA1. Therefore, the length of the first and second protrusions PP1 and PP2 arranged in the first boundary area BA1 and the distance therebetween are not changed, and thus, a change in mutual capacitance occurring between the first and second protrusions PP1 and PP2 may be prevented.

As such, in the touch display device according to this embodiment of the present invention, the distance d1 between the first and second protrusions PP1 and PP2 arranged in the first boundary area BA1 and the distance d2 between the first or second protrusions PP1 or PP2 and the third protrusions PP3 arranged in the second boundary area BA2 are different. The first and second boundary areas BA1 and BA2 including the protrusions PP1, PP2 and PP3 having different distances therebetween are visibly different when observed using inspection equipment. Therefore, an inspector may easily recognize an electrical short defect between the first and second touch electrodes 152e and 154e arranged in the first boundary area BA1 and easily detect the position of the defect where the repair process is necessary, thereby being capable of improving efficiency of the inspection and repair processes.

Figure 10:
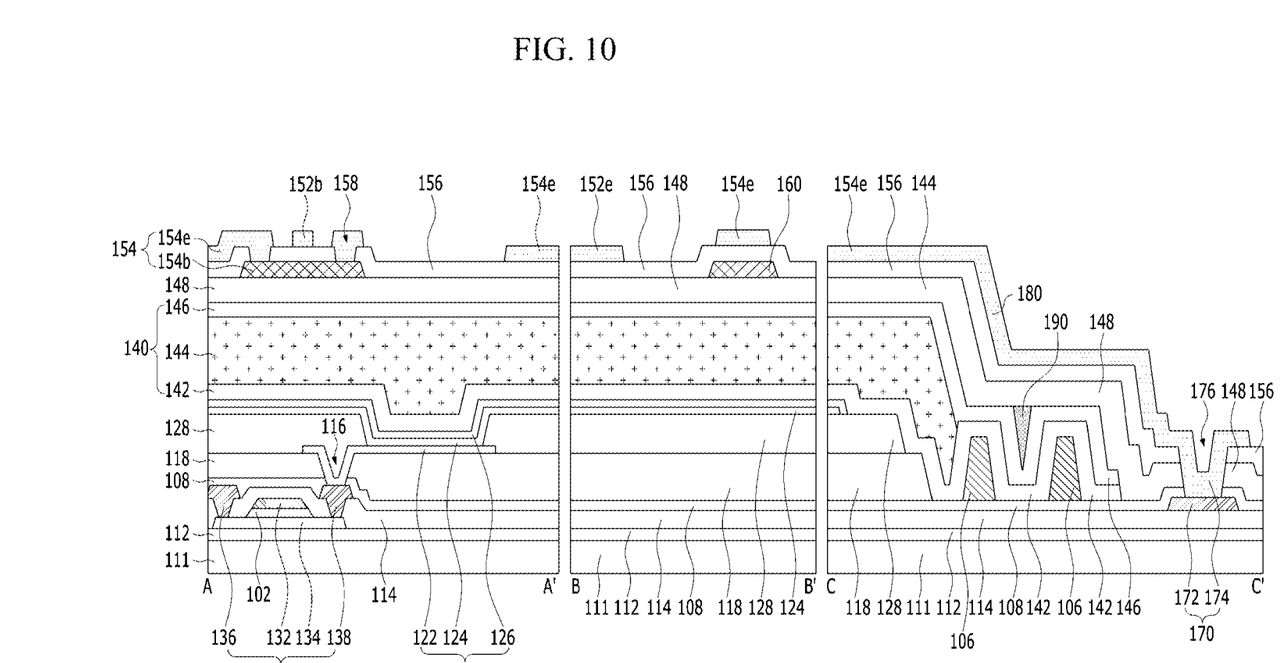
FIG. 10 is a cross-sectional view illustrating the touch display device, taken along lines A-A', B-B' and C-C' of FIG. 1.

The first and second touch electrodes 152e and 154e and the dummy conductive layer 150 arranged in the first and second boundary areas BA1 and BA2 are directly formed on light emitting elements 120, as shown in FIG. 10. The cross-sectional view of the touch display device shown in FIG. 10 is applied to the touch display device including the edge mark layer 160 shown in FIGS. 4, 5A and 5B, without being limited thereto. That is, the cross-sectional view of the touch display device shown in FIG. 10 may be applied to the touch display devices excluding the edge mark layer 160 shown in FIGS. 6 to 9.

As shown in FIG. 10, the touch display device includes the subpixels arranged in a matrix on the substrate 111, the encapsulation unit 140, and the touch electrodes 152e and 154e arranged on the encapsulation unit 140.

The substrate 111 is formed of plastic or glass having flexibility so as to be foldable or bendable. For example, the substrate 111 is formed of polyimide (PI), polyethylene terephthalate (PET), polyethylene naphthalate (PEN), polycarbonate (PC), polyethersulfone (PES), polyarylate (PAR), polysulfone (PSF) or cyclic olefin copolymer (COC).

Each of the subpixels includes a pixel driving circuit including a plurality of thin film transistors 130, and the light emitting element 120 connected to the pixel driving circuit.

The thin film transistor 130 included in the pixel driving circuit includes a semiconductor layer 134 arranged on a multi-buffer film 112, a gate electrode 132 configured to overlap the semiconductor layer 134 with a gate insulating film 102 interposed therebetween, and source and drain electrodes 136 and 138 formed on an interlayer insulating film 114 so as to contact the semiconductor layer 134. Here, the semiconductor layer 134 is formed of at least one of an amorphous semiconductor material, a polycrystalline semiconductor material and an oxide semiconductor material.

The light emitting element 120 may include an anode 122, at least one light emitting stack 124 formed on the anode 122, and a cathode 126 formed on the at least one light emitting stack 124.

The anode 122 is conductively connected to the drain electrode 138 of the thin film transistor 130 exposed through a pixel contact hole 116 formed through a protective film 108 and a pixel planarization layer 118.

The at least one light emitting stack 124 is formed on the anode 122 in the emitting area prepared by a bank 128. The at least one light emitting stack 124 is formed by stacking a hole-related layer, an organic light emitting layer and an electron-related layer on the anode 122 in regular order or in reverse order. The at least one light emitting stack 124 may include first and second light emitting stacks disposed opposite each other with a charge generation layer interposed therebetween. In this case, the organic light emitting layer of one of the first and second light emitting stacks generates blue light and the organic light emitting layer of the other of the first and second light emitting stacks generates yellow-green light and, thus, white light is produced through the first and second light emitting stacks. White light produced by the at least one light emitting stack 124 is incident upon color filters located on the upper or lower surface of the at least one light emitting stack 124, thus being capable of implementing a color image. Otherwise, without separate color filters, each light emitting stack 124 may generate color light corresponding to each subpixel, thus being capable of implementing a color image. That is, the light emitting stack 124 of the red subpixel may generate red light, the light emitting stack 124 of the green subpixel may generate green light, and the light emitting stack 124 of the blue subpixel may generate blue light.

The cathode 126 is formed opposite the anode 122 with the at least one light emitting stack 124 disposed therebetween.

The encapsulation unit 140 prevents external moisture or oxygen from permeating the light emitting element 120, which is vulnerable to external moisture or oxygen. For this purpose, the encapsulation unit 140 includes at least one inorganic encapsulation layer and at least one organic encapsulation layer. In the present invention, the encapsulation unit 140 having a structure in which a first inorganic encapsulation layer 142, an organic encapsulation layer 144 and a second inorganic encapsulation unit 146 are sequentially stacked will be described as one example.

The first inorganic encapsulation layer 142 is formed on the substrate 111 provided with the cathode 126 formed thereon. The second inorganic encapsulation layer 146 is formed on the substrate 111 provided with the organic encapsulation unit 144 formed thereon, and the first inorganic encapsulation layer 142 and the second inorganic encapsulation layer 146 are formed to surround the upper, lower and side surfaces of the organic encapsulation layer 144.

The first and second inorganic encapsulation layers 142 and 146 minimize or prevent permeation of external moisture or oxygen into the at least one light emitting stack 124. The first and second inorganic encapsulation layers 142 and 146 are formed of an inorganic insulating material which may be deposited at a low temperature, such as silicon nitride ($SiN_x$), silicon oxide ($SiO_x$), silicon oxynitride (SiON) or aluminum oxide ($Al_2O_3$). Therefore, since the first and second inorganic encapsulation layers 142 and 146 are deposited in a low-temperature atmosphere, damage to the at least one light emitting stack 124, which is vulnerable to a high-temperature atmosphere, during a process of depositing the first and second inorganic encapsulation layers 142 and 146 may be prevented.

The organic encapsulation layer 144 serves as a buffer to relieve stress between respective layers depending on bending of the organic light emitting diode display, and strengthens planarization performance of the organic light emitting diode display. The organic encapsulation layer 144 is formed of a non-photosensitive organic insulating material, such as polycaprolactone (PCL), acrylic resin, epoxy resin, polyimide, polyethylene or silicon oxycarbide (SiOC), or a photosensitive organic insulating material, such as photoacryl, on the substrate 111 provided with the first inorganic encapsulation layer 142 formed thereon. The organic encapsulation layer 144 is arranged in the active area, but not in the non-active areas. For this purpose, at least one dam 106 is arranged so as to prevent the organic encapsulation layer 144 from diffusing into the non-active areas. The at least one dam 106 is formed of the same material as at least one of the pixel planarization layer 118, the bank 128 and a spacer (not shown). If a plurality of dams 106 is provided, an outer planarization layer 190 may be arranged between the dams 106. The outer planarization layer 190 is formed of an acryl-based, epoxy-based or siloxane-based organic insulating material having a high planarization function, and thus planarizes a step difference caused by the height of the dams 106. Therefore, the routing line 180 is formed evenly on the outer planarization layer 190 and the dams 106, without step differences therebetween, thus being capable of preventing a disconnection or a short of the routing line 180 traversing the dams 106. Further, if a plurality of dams 106 is provided, the organic encapsulation layer 144 extends to a region between the dams 106, and may thus fill the region between the dams 106.

The touch driving lines 152 including the first touch electrodes 152e and the first bridges 152b, the touch sensing lines 154 including the second touch electrodes 154e and the second bridges 154b, the dummy conductive layer 150 and the edge mark layer 160 are arranged on the encapsulation unit 140.

The edge mark layer 160 may be formed of the same material on the same plane as the second bridges 154b (for example, on a touch buffer film 148). That is, the edge mark layer 160 may be formed together with the second bridges 154b through the same mask process. Alternatively, if the first bridges 152b are arranged on a different plane from the first and second touch electrodes 152e and 154e, the edge mark layer 160 may be formed of the same material on the same plane as the first bridges 152b.

In order to prevent an increase in parasitic capacitance between each of the first and second touch electrodes 152e and 154e and the first and second bridges 152b and 154b and the cathode 126, the touch buffer film 148 including inorganic and/or organic insulating films may be arranged on the encapsulation unit 140.

The routing lines 180 respectively connected to the first and second touch electrodes 152e and 154e are arranged along the side surface of the encapsulation unit 140. If the touch buffer film 148 is provided, the routing lines 180 contact the side surface of the touch buffer film 148, and if the touch buffer film 148 is not provided, the routing lines 180 contact the side surface of the second inorganic encapsulation layer 146.

Each of the touch pads 170 connected to the routing lines 180 includes a lower touch pad electrode 172, and an upper touch pad electrode 174 contacting the lower touch pad electrode 172. The lower touch pad electrode 172 is formed of the same material on the same plane as at least one of the gate electrode 132 and the drain electrode 138. For example, the lower touch pad electrode 172 is formed of the same material on the same plane as the drain electrode 138, i.e., on the interlayer insulating film 114. The upper touch pad electrode 174 is formed of the same material on the same plane as the first and second touch electrodes 152e and 154e. The upper touch pad electrode 174 is conductively connected to the lower touch pad electrode 172 exposed through a pad contact hole 176 formed through the protective film 108, the touch buffer film 148 and the touch insulting film 156.

Figure 11:
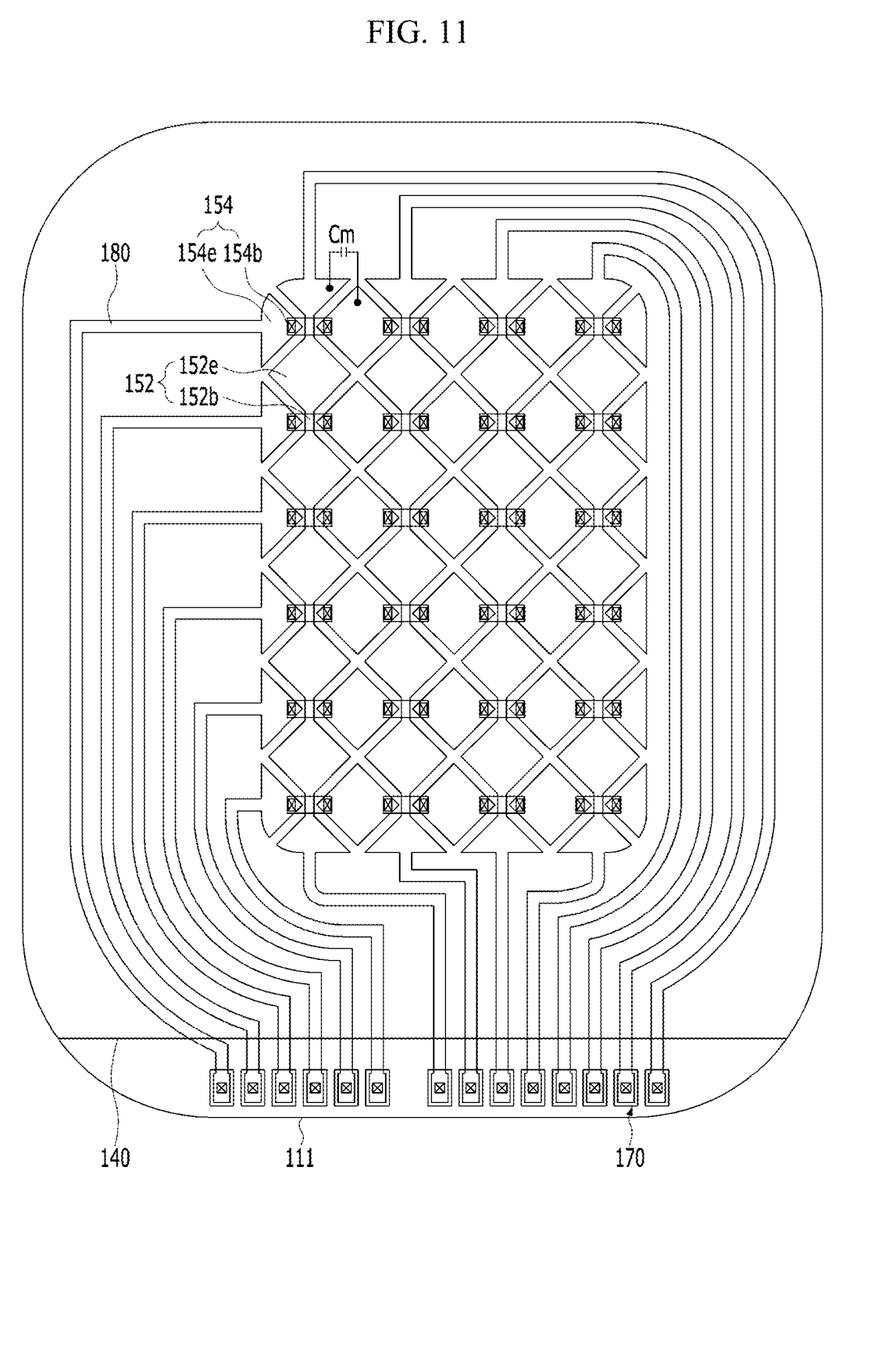
FIG. 11 is a plan view illustrating a touch display device according to the present invention to which a different design is applied.

Although the present invention describes that the touch display device has a rectangular shape, as shown in FIG. 1, as one example, the touch display device may be designed in various shapes other than the rectangular shape for use in, for example, a wearable apparatus, a flexible apparatus, an instrument panel, etc. For example, the touch display device may be designed in a different shape, such as a curved shape, as shown in FIG. 11, a diagonal shape, a circular shape, an oval shape or a polygonal shape.

In such a touch display device having a different design, touch electrodes 152e and 154e and routing lines 180 are changed so as to correspond to portions of the touch display device to which the different design is applied. For example, as shown in FIG. 11, when the corner areas of a substrate 111 of the touch display device are formed in a curved shape, the touch electrodes 152e and 154e and the routing lines 180 arranged in or adjacent to the corner areas are formed in a curved shape along the curved corner areas. The sizes and shapes of the touch electrodes 152e and 154e arranged in or adjacent to the corner areas are different from each other, and the sizes of the touch electrodes 152e and 154e arranged in the corner areas are smaller than the sizes of the touch electrodes 152e and 154e arranged in areas other than the corner areas.

Further, although the present invention describes that the first and second touch electrodes 152e and 154e having the dummy conductive layer 150 are arranged on the light emitting elements 120 which are display elements, the first and second touch electrodes 152e and 154e having the dummy conductive layer 150 may be arranged on display elements including liquid crystal elements or the like.

As is apparent from the above description, a touch display device according to the present invention is characterized in that the shape of at least one of first protrusions and second protrusions arranged in a first boundary area is different from the shape of at least one of the first protrusions, the second protrusions and the third protrusions arranged in a second boundary area, thereby allowing an inspector to easily distinguish the first and second boundary areas from each other. Therefore, the inspector may easily recognize an electrical short defect between the first and second touch electrodes arranged in the first boundary area and easily detect the position of the defect where a repair process is necessary.

It will be apparent to those skilled in the art that various modifications and variations can be made in the touch display device of present disclosure without departing from the technical spirit or scope of the disclosure. Thus, it is intended that the present disclosure cover the modifications and variations of this disclosure provided they come within the scope of the appended claims and their equivalents.

What is claimed is:

1. A touch display device, comprising:
   light emitting elements arranged on a substrate;
   at least one encapsulation layer arranged on the light emitting elements;
   first touch electrodes arranged on the encapsulation layer;
   second touch electrodes arranged on the encapsulation layer and spaced apart from the first touch electrodes in first boundary areas;
   a dummy conductive layer arranged on the encapsulation layer and spaced apart from at least one of the first touch electrodes and second touch electrodes in second boundary areas; and
   an edge mark layer arranged in one of the first boundary areas and the second boundary areas,
   wherein the edge mark layer overlaps entirely with at least one of the first touch electrodes, the second touch electrodes, and the dummy conductive layer, and
   wherein one of the first touch electrodes adjacent to one of the second touch electrodes in one of the first boundary areas overlaps the edge mark layer, and one of the first touch electrodes adjacent to the dummy conductive layer in one of the second boundary areas does not overlap the edge mark layer.

2. The touch display device according to claim 1, wherein:
   the first touch electrodes comprise first protrusions arranged in the first and second boundary areas;
   the second touch electrodes comprise second protrusions arranged in the first and second boundary areas; and
   the dummy conductive layer comprises third protrusions arranged in the second boundary areas.

3. The touch display device according to claim 2, wherein a cross-sectional shape of at least one of the first protrusions and the second protrusions arranged in the first boundary areas protrudes further than a cross-sectional shape of at least one of the first protrusions, the second protrusions and the third protrusions arranged in the second boundary areas.

4. The touch display device according to claim 2, wherein the edge mark layer overlaps entirely with at least one of the first protrusions, the second protrusions,. and the third protrusions.

5. The touch display device according to claim 4, wherein the edge mark layer overlaps at least one of the first protrusions, the second protrusions and the third protrusions with an insulating layer interposed therebetween.

6. The touch display device according to claim 4, further comprising:
   first bridges configured to connect the first touch electrodes; and
   second bridges configured to connect the second touch electrodes and arranged on a different plane from the first bridges,
   wherein the edge mark layer is formed of the same material on the same plane as one of the first and second bridges.

7. The touch display device according to claim 1, further comprising banks arranged between anodes of the light emitting elements,
   wherein the first and second touch electrodes and the dummy conductive layer are formed as a mesh configured to overlap the banks.

8. The touch display device of claim 1, wherein the edge mark layer overlaps one of the first touch electrodes and the second touch electrodes in one of the first boundary areas without being disposed in one of the second boundary areas.

9. The touch display device of claim 1, wherein one of the first touch electrodes adjacent to one of the second touch electrodes in one of the first boundary areas is farther away from the substrate in a cross-sectional view than one of the first touch electrodes adjacent to the dummy conductive layer in one of the second boundary areas.

10. A touch display device, comprising:

first touch electrodes arranged on a substrate;

second touch electrodes arranged on the substrate and spaced apart from the first touch electrodes in first boundary areas;

a dummy conductive layer arranged on the substrate and spaced apart from at least one of the first touch electrodes and the second touch electrodes in second boundary areas; and an edge mark layer arranged in one of the first boundary areas and the second boundary areas, wherein the edge mark layer overlaps entirely with at least one of the first touch electrodes, the second touch electrodes, and the dummy conductive layer, and wherein one of the first touch electrodes adjacent to one of the second touch electrodes in one of the first boundary areas overlaps the edge mark layer, and one of the first touch electrodes adjacent to the dummy conductive layer in one of the second boundary areas does not overlap the edge mark layer.

11. The touch display device according to claim 1, wherein:

corner areas of the substrate are formed in a curved or diagonal shape.

12. The touch display device according to claim 11, further comprising a routing line connected to the at least one of the first and second touch electrodes, wherein the at least one of the routing line, the first touch electrodes, and second touch electrodes are formed in the curved or diagonal shape along the corner areas.

13. The touch display device of claim 10, wherein the edge mark layer overlaps one of the first touch electrodes and the second touch electrodes in one of the first boundary areas without being disposed in one of the second boundary areas.

14. The touch display device of claim 10, wherein one of the first touch electrodes adjacent to one of the second touch electrodes in one of the first boundary areas is farther away from the substrate in a cross-sectional view than one of the first touch electrodes adjacent to the dummy conductive layer in one of the second boundary areas.

* * * * *